(12) United States Patent
Carter et al.

(10) Patent No.: US 7,786,765 B2
(45) Date of Patent: Aug. 31, 2010

(54) LOW VOLTAGE SHUTDOWN CIRCUIT

(75) Inventors: Nathan R. Carter, Santa Clara, CA (US); Yu-Lun Richard Lu, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 115 days.

(21) Appl. No.: 12/070,217

(22) Filed: Feb. 15, 2008

(65) Prior Publication Data

US 2008/0197888 A1 Aug. 21, 2008

Related U.S. Application Data

(60) Provisional application No. 60/890,674, filed on Feb. 20, 2007.

(51) Int. Cl.
H03K 5/22 (2006.01)
H03K 5/153 (2006.01)
(52) U.S. Cl. .......................... 327/77; 327/143; 327/198
(58) Field of Classification Search .................. 327/77, 327/142, 143, 198, 539; 323/313, 315
See application file for complete search history.

(56) References Cited

U.S. PATENT DOCUMENTS

| | | | | |
|---|---|---|---|---|
| 6,016,050 A | * | 1/2000 | Brokaw | 323/315 |
| 6,172,555 B1 | * | 1/2001 | Gusinov | 327/539 |
| 6,995,587 B2 | * | 2/2006 | Xi | 327/77 |
| 7,440,249 B2 | * | 10/2008 | Sheng et al. | 361/92 |
| 7,482,847 B2 | * | 1/2009 | Suzuki | 327/143 |
| 2003/0227306 A1 | * | 12/2003 | Di Iorio | 327/143 |

FOREIGN PATENT DOCUMENTS

| | | | | |
|---|---|---|---|---|
| JP | 59176680 A | * | 10/1984 | |
| JP | 05196660 A | * | 8/1993 | |

* cited by examiner

*Primary Examiner*—Quan Tra
(74) *Attorney, Agent, or Firm*—Koppel, Patrick, Heybl & Dawson

(57) ABSTRACT

A low voltage shutdown circuit comprises an input node for receiving a voltage $V_{in}$ to be monitored, first and second voltage-to-current (V to I) converters arranged to receive $V_{in}$ at respective inputs and to convert $V_{in}$ to currents I1 and I2 at respective outputs, and a current comparison circuit arranged to produce an output which is in a first state when I1<I2 and in a second state when I1>I2. The V to I converters have respective voltage-to-current transfer functions which intersect at a non-zero threshold voltage $V_{th}$, such that the current comparison circuit output toggles when $V_{in}<V_{th}$. This output can be used as needed to, for example, trigger the shut down of other circuitry.

9 Claims, 5 Drawing Sheets

LOW VOLTAGE SHUTDOWN CIRCUIT

RELATED APPLICATIONS

This application claims the benefit of provisional patent application No. 60/890,674 to Nathan R. Carter and Yu-lun Richard Lu, filed Feb. 20, 2007.

BACKGROUND OF THE INVENTION

1. Field of the Invention

This invention relates generally to circuits which monitor a voltage or current and generate a shutdown signal when the monitored parameter falls below a threshold value.

2. Description of the Related Art

Many electronic circuits require a means of shutting down when a particular voltage or current falls below a defined threshold point. However, it can be difficult to shut down the circuit when there is little or no current available and at the same time have a defined threshold point that is compatible with various logic standards and consistent across temperature and process.

SUMMARY OF THE INVENTION

A low voltage shutdown circuit is presented which overcomes the problems noted above, providing a precise and repeatable threshold even when the available current is as low as 1 µA or less.

The present low voltage shutdown circuit, comprises an input node for receiving a voltage $V_{in}$ to be monitored, first and second voltage-to-current (V to I) converters arranged to receive $V_{in}$ at respective inputs and to convert $V_{in}$ to currents I1 and I2 at respective outputs, and a current comparison circuit arranged to produce an output which is in a first state when I1<I2 and in a second state when I1>I2. The V to I converters are arranged such that their respective voltage-to-current transfer functions intersect at a non-zero threshold voltage $V_{th}$. When so arranged, the current comparison circuit output toggles when $V_{in}$ falls below $V_{th}$. This output can thus be used as needed to, for example, trigger the shut down of other circuitry.

These and other features, aspects, and advantages of the present invention will become better understood with reference to the following drawings, description, and claims.

DETAILED DESCRIPTION OF THE INVENTION

The present low voltage shutdown circuit provides a means of monitoring a voltage or current and generating a shutdown signal when the monitored parameter falls below a defined threshold. The circuit is capable of providing a precise and repeatable threshold even when the available current is as low as 1 µA or less.

Figure 1:
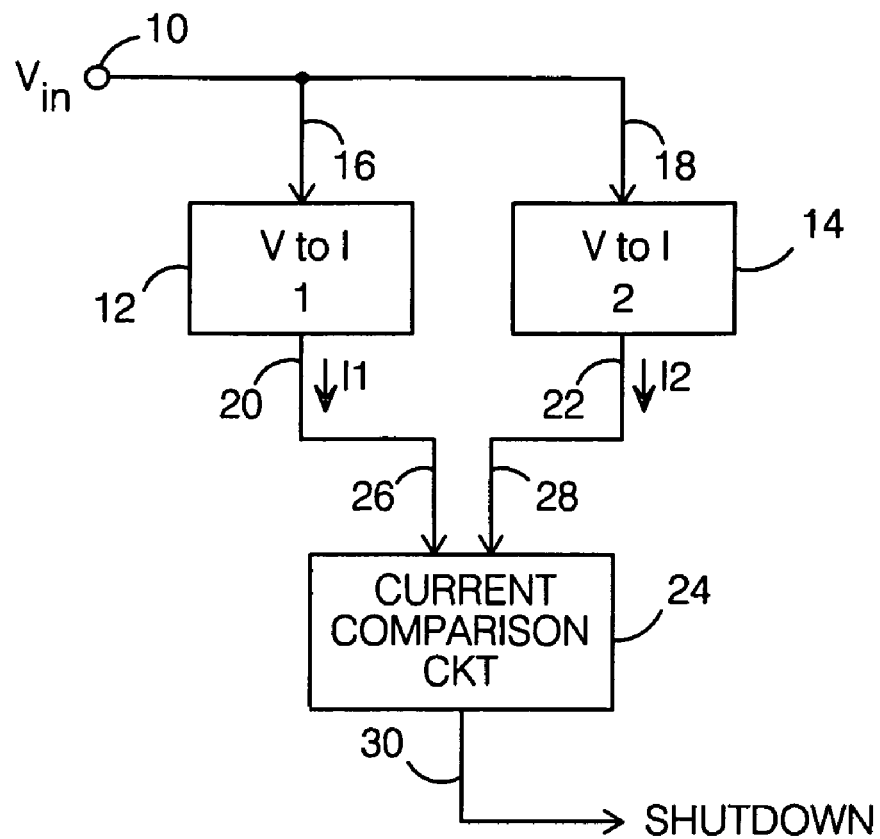
FIG. 1 is a block diagram illustrating the principles of a low voltage shutdown circuit per the present invention.

The basic principles of a low voltage shutdown circuit in accordance with the present invention are shown in FIG. 1. A parameter to be monitored, here, a voltage $V_{in}$, is applied to an input node 10. Alternatively, a current to be monitored can be applied at node 10, in which case a resistor would be connected in series with node 10 such that voltage $V_{in}$ appears at the node in response to the current.

Figure 2:
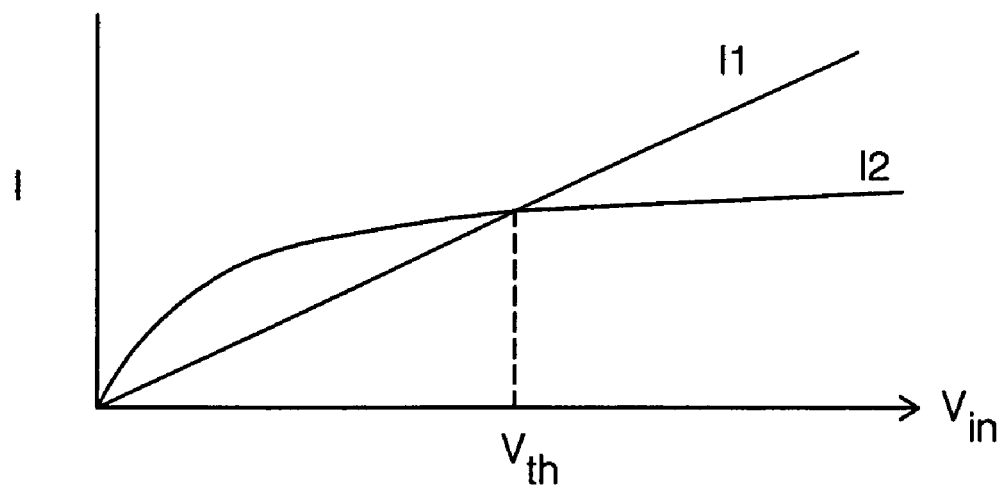
FIG. 2 is a plot of one possible pair of voltage-to-current transfer functions for respective V to I converters as might be employed per the present invention.

First and second V to I converters 12, 14 receive $V_{in}$ at respective inputs 16, 18, and convert $V_{in}$ to currents I1 and I2 at respective outputs 20, 22. Converters 12 and 14 have respective voltage-to-current transfer functions; exemplary plots of $V_{in}$ versus I1 and $V_{in}$ versus I2 are shown in FIG. 2. The converters are arranged such that their respective transfer functions intersect at a defined non-zero threshold voltage, referred to herein as $V_{th}$.

The present shutdown circuit also includes a current comparison circuit 24, which receives I1 and I2 at respective inputs 26, 28, and is arranged to produce an output 30 (SHUTDOWN) which is in a first state when I1<I2 and in a second state when I1>I2. When so arranged, current comparison circuit output 30 toggles when $V_{in}$ falls below $V_{th}$; this output can then be used as needed to, for example, trigger the shut down of other circuitry, such as a bias current generating circuit.

Figure 3A:
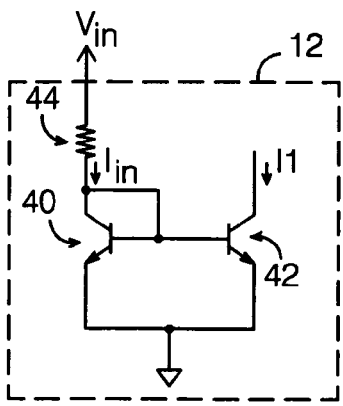
FIG. 3a is a schematic diagram of one possible implementation of a V to I converter per the present invention.

Exemplary implementations of V to I converters 12 and 14 are shown in FIGS. 3a-3c and FIG. 4. For example, FIG. 3a depicts a basic current mirror consisting of a first bipolar transistor 40 and a second bipolar transistor 42. A resistor 44 is connected in series with $V_{in}$ so that a current $I_{in}$ which varies with $V_{in}$ is provided to the input side of the mirror. When so arranged, the output current (here labeled as I1) varies with $V_{in}$, thereby forming a V to I converter such as converter 12.

Figure 3B:
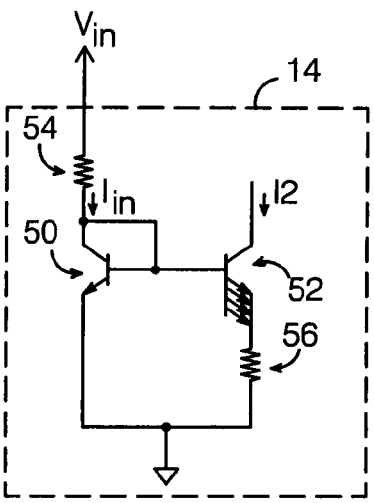
FIG. 3b is a schematic diagram of another possible implementation of a V to I converter per the present invention.

Another possible V to I converter implementation is shown in FIG. 3b. This converter is similar to that shown in FIG. 3a, in that it consists of first and second bipolar transistors 50 and 52, and a resistor 54 connected in series with $V_{in}$. However, here, a degeneration resistor 56 is connected in the emitter circuit of transistor 52. When so arranged, the output current (here labeled as I2) varies with $V_{in}$, thereby forming a V to I converter such as converter 14.

In addition, assuming that the V to I converter of FIG. 3a is used to produce I1, the emitter size of transistor 52 is made larger than that of transistor 42. The addition of emitter degeneration resistor 56 and the difference in emitter sizes will make the voltage-to-current transfer function of the FIG. 3b circuit different from that of the FIG. 3a circuit. In this case, current I2 will increase faster than current I1 when $V_{in}$ starts to increase, due to the larger emitter area of transistor 52. However, the I2 curve will flatten out with increasing $V_{in}$ due to the degeneration resistor, whereas the I1 current in FIG. 3a will increase linearly with $V_{in}$. When the converters of FIGS. 3a and 3b are so arranged, their respective transfer functions will resemble those shown in FIG. 2, such that they intersect at a non-zero threshold voltage $V_{th}$ which can be set as needed for a particular application. Current comparison circuit 24 is then arranged to compare I1 and I2, and to generate a shutdown signal when the currents indicate that $V_{in}$ has fallen below $V_{th}$.

Figure 3C:
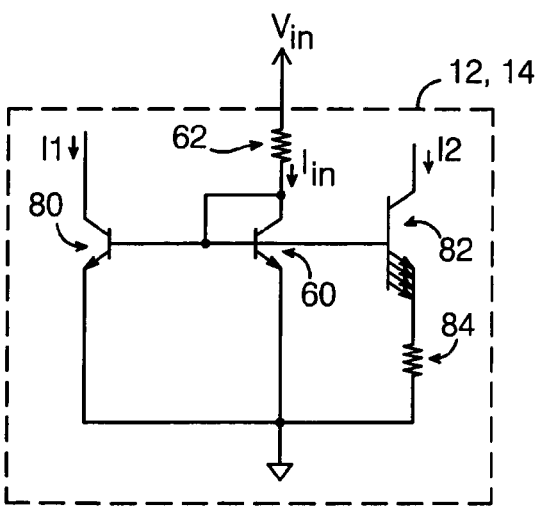
FIG. 3c is a schematic diagram of one possible implementation of first and second V to I converters per the present invention.

FIG. 3c depicts an implementation which includes both V to I converters 12 and 14. Here, a single diode-connected bipolar transistor 60 is used to generate both I1 and I2; $V_{in}$ is connected to transistor 60 via a resistor 62 as before. Current I1 is generated with a transistor 80 connected to form a current mirror with transistor 60, and a transistor 82 is connected to conduct I2. In this example, the V to I transfer functions are differentiated by making the emitter area of the transistor 82 conducting I2 greater than that of the transistor 80 conducting I1, and by connecting a degeneration resistor 84 in the emitter circuit of transistor 82. As discussed above, the difference in transistor sizes and the degeneration resistor cause the respective voltage-to-current transfer functions to differ, and to intersect at a non-zero threshold voltage $V_{th}$ when the components of FIG. 3c are properly selected.

Note that there are many other ways in which the required V to I converters could be implemented. It is only necessary that the voltage-to-current transfer functions of the two V to I converters be different and arranged to intersect at a defined threshold voltage.

In very low power applications, it may be useful to keep the current drawn by the shutdown circuit to a minimum. For the implementations discussed above, the current drawn by transistors with an emitter degeneration resistor will flatten out with increasing $V_{in}$, but the current drawn by the other, non-degenerated transistor will increase linearly with $V_{in}$. The implementation of V to I converters 12 and 14 shown in FIG. 4 enables the current drawn by the shutdown circuit to be reduced with respect to the implementations described above. Here, $V_{in}$ is applied to resistors 90 and 92 connected in series between $V_{in}$ and a node 94. A bipolar transistor 96 is connected between node 94 and a circuit common point, with the transistor's base coupled to the junction (98) between resistors 90 and 92. A bipolar transistor 100 is connected to form a current mirror with transistor 96 and conducts current I1, and a bipolar transistor 102 has its base connected to node 94 and its emitter connected to common and conducts current I2; the emitter area of the transistor 102 should be larger than that of the transistor 100.

Figure 4:
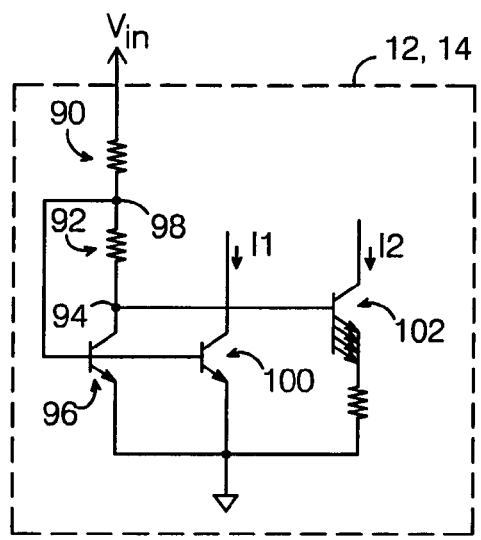
FIG. 4 is a schematic diagram of another possible implementation of first and second V to I converters per the present invention.
Figure 5:
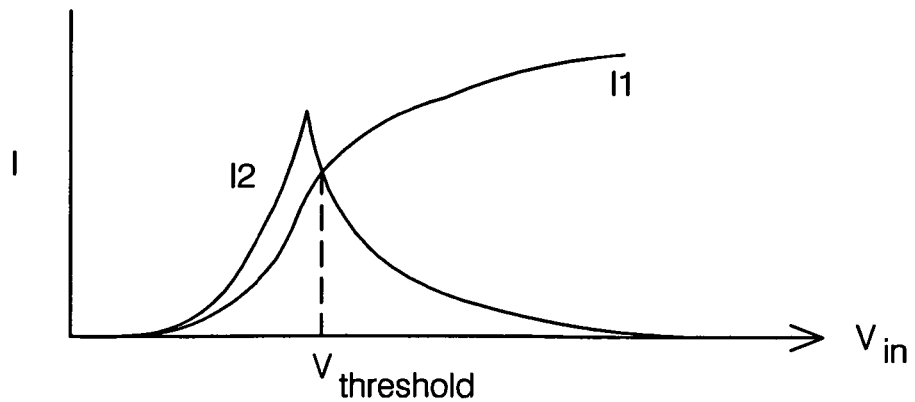
FIG. 5 is a plot of one possible pair of voltage-to-current transfer functions as might be provided by the V to I converters of FIG. 4.

The operation of the circuit of FIG. 4 is illustrated in FIG. 5. As $V_{in}$ increases, current starts flowing through diode-connected transistor 96, and is mirrored to transistors 100 and 102. For smaller values of $V_{in}$, there is not much current flowing through resistor 92, so the voltage drop across resistor 92 is small and therefore the current through transistor 102 is almost equal to that through transistor 96. Therefore, as $V_{in}$ increases, the current through transistor 102 is also increasing. Because transistor 102 is larger than transistor 100, I2 increases more rapidly than I1 when $V_{in}$ first starts to increase. However, as $V_{in}$ continues increasing, it will reach a point such that the increasing current through resistor 92 causes the voltage drop across it to become significant. This causes the base-emitter voltage of transistor 102 to decrease, and consequently the current through transistor 102. In this way, the total current drawn by the shutdown circuit is reduced. The emitter of transistor 102 is preferably larger than the emitters of transistors 100 and 96, such that I2 increases more rapidly than I1 when $V_{in}$ first starts to increase.

Figure 6B:
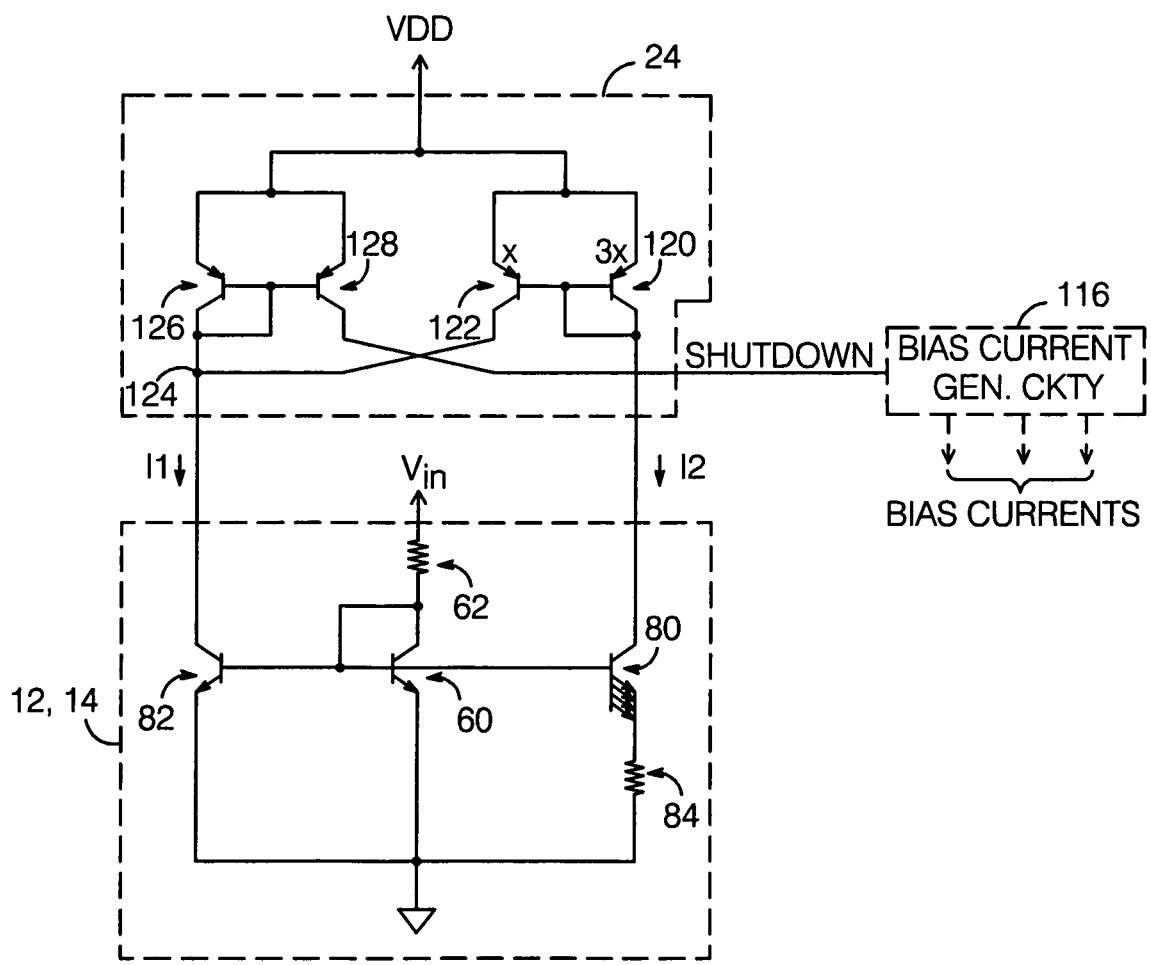
FIG. 6b is a schematic diagram of another possible implementation of first and second V to I converters, and a current comparison circuit, per the present invention.
Figure 6A:
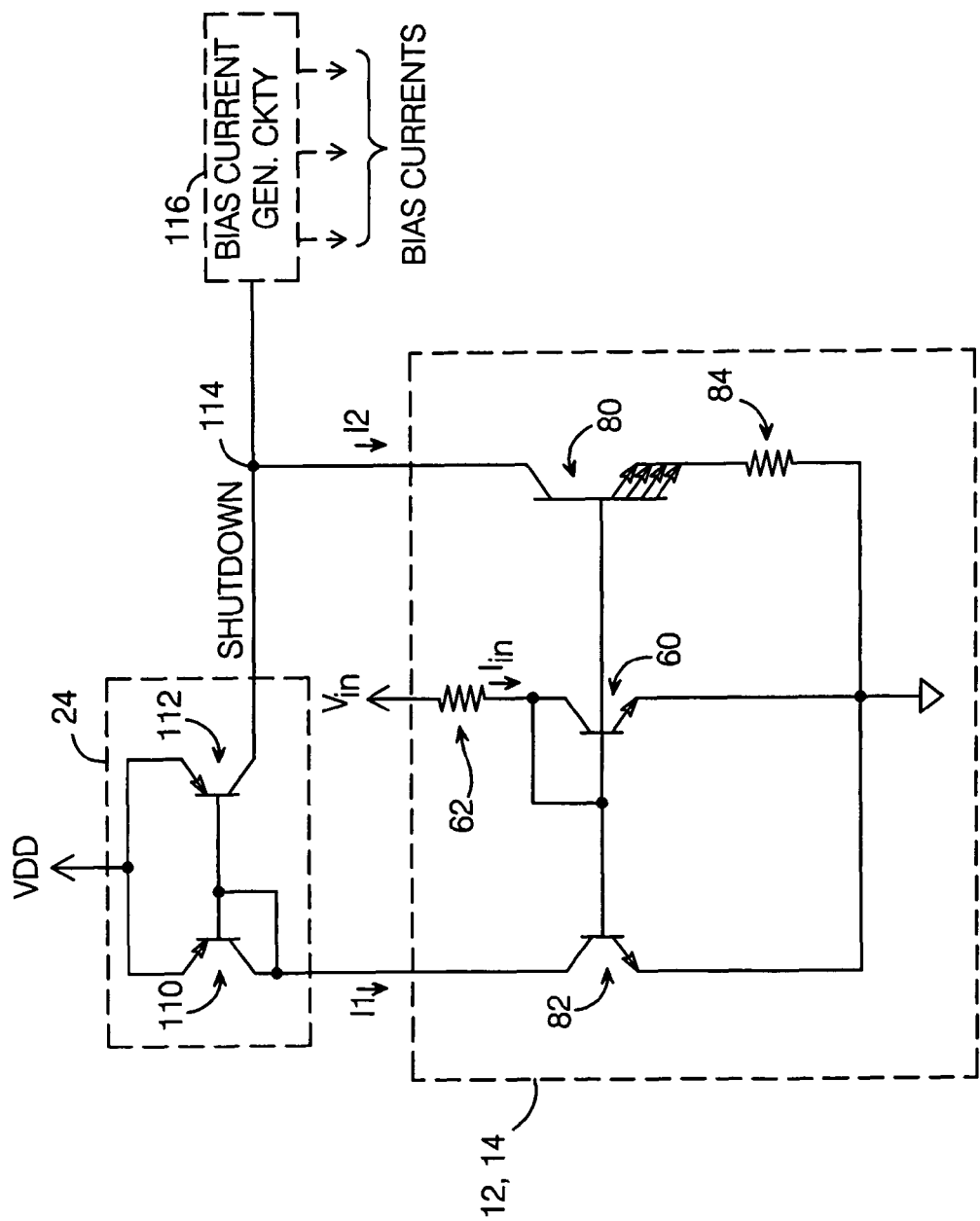
FIG. 6a is a schematic diagram of one possible implementation of first and second V to I converters, and a current comparison circuit, per the present invention.

One possible implementation of current comparison circuit 24 is shown in FIG. 6a. In this example, V to I converters 12, 14 are as shown in FIG. 3c. The combination of resistor 62, transistor 60 and transistor 82 produces a current (I1) which is generally linear with $V_{in}$, while the combination of resistor 62, transistor 60, transistor 80 and resistor 84 produces a current (I2) which is non-linear with $V_{in}$, such that the respective V to I profiles intersect at threshold voltage $V_{th}$ (as shown in FIG. 2).

Currents I1 and I2 are compared using current comparison circuit 24. One possible implementation for current comparison circuit 24 is a simple current mirror, as shown in FIG. 6a. Here, a diode-connected transistor 110 is connected to conduct I1, and a transistor 112 is connected to form a VDD-referred current mirror with transistor 110 and to conduct I2, with the junction 114 of transistors 112 and 80 serving as the SHUTDOWN output of the current comparison circuit. Assuming that transistors 110 and 112 form a 1:1 current mirror, the SHUTDOWN signal will be a positive current when I1>I2. However, when I1 is less than or equal to I2, indicating that $V_{in} \leq V_{th}$, there is no current available for the SHUTDOWN signal. Thus, the presence or absence of a positive SHUTDOWN current indicates when $V_{in}$ has fallen below $V_{th}$.

The threshold voltage can be adjusted by, for example, changing the ratio between the mirror transistors. For example, if transistors 110 and 112 are arranged to form a 2:1 current mirror, the SHUTDOWN signal will be a positive current when I1>2*I2, and will be zero otherwise.

The SHUTDOWN signal can be used to, for example, control the operation of a bias current generating circuit 116 which is used to generate bias currents for circuitry which is not shown. Thus, for this exemplary application, when $V_{in}$ falls below $V_{th}$, SHUTDOWN causes bias current generating circuit 116 to shut down.

An alternative implementation of current comparison circuit 24 is shown in FIG. 6b, made up of transistors 120, 122, 126 and 128. Transistors 120 and 122 form a first VDD-referred current mirror, which mirrors current I2 to a node 124. Transistors 126 and 128 form a second current mirror, the input of which (node 124) is connected to current I1. In operation, first mirror 120/122 serves to compare I2 with I1, with the result being fed to the input of the second mirror. The output of the second mirror serves as the SHUTDOWN output of the current comparison circuit.

In the exemplary embodiment shown, the emitter area of transistor 120 is 3 times that of transistor 122. Thus, when I1>3*I2, the difference between I1 and 3*I2 is delivered to node 124 and mirrored to the SHUTDOWN output by the second current mirror (126/128). However, when I1 falls below 3*I2, indicating that $V_{in}<V_{th}$, there is no current available to be mirrored to SHUTDOWN. Thus, the presence or absence of a positive SHUTDOWN current indicates when $V_{in}$ has fallen below $V_{th}$. Note that the magnitude of the SHUTDOWN current can be scaled by adjusting the ratio between transistors 126 and 128.

Note that the implementation of current comparison circuits 24 shown in FIGS. 6a and 6b are merely exemplary; it is only necessary that the comparison circuit produce an output that toggles when $V_{in}$ falls below $V_{th}$.

Figure 7:
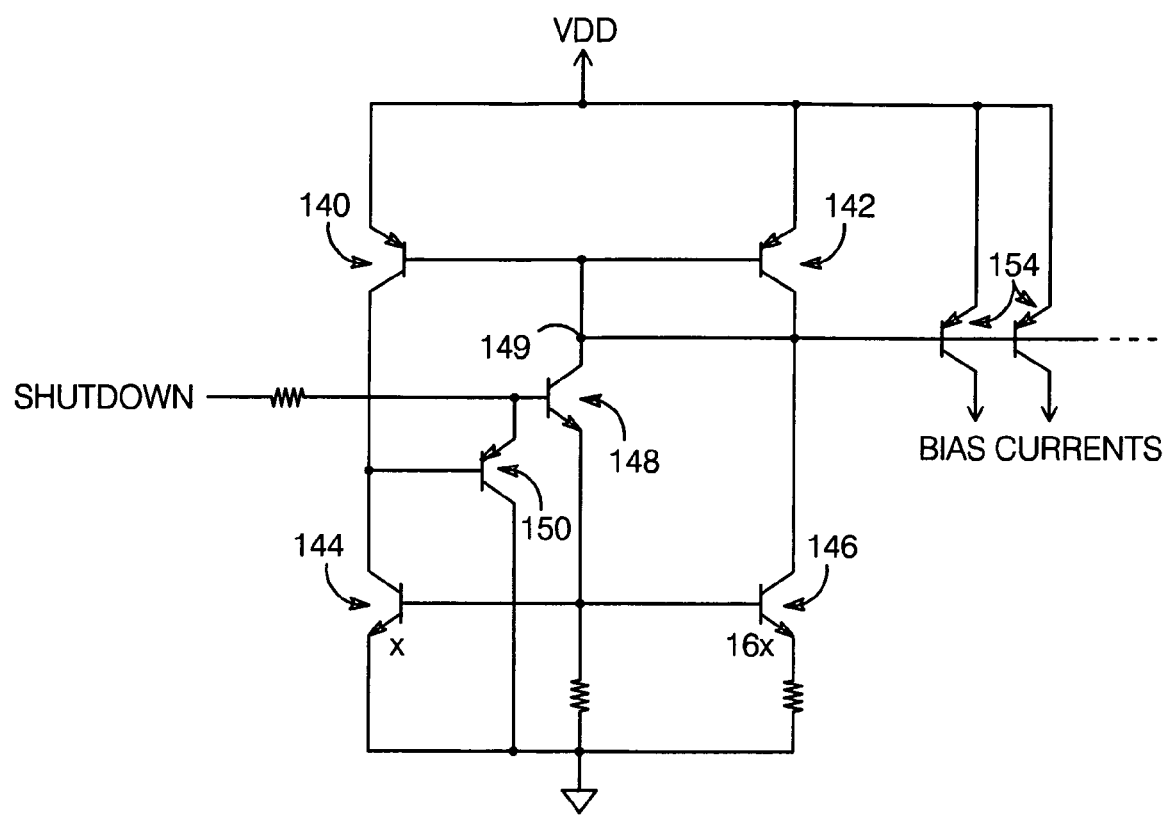
FIG. 7 is a schematic diagram showing a bias current generating circuit which might be used with a low voltage shutdown circuit per the present invention.

The present shutdown circuit is well-suited for use with a bias current generating circuit 116 such as that shown in FIG. 7. Here, transistors 140, 142, 144 and 146 form a bandgap voltage source, with transistor 146 providing a current which is proportional-to-absolute current (PTAT) and transistor 148 providing a current which is complementary-to-absolute current (CTAT); these currents are summed together in transistor 142 and provided at a node 149. When the base of transistor 148 is coupled to the collector of transistor 144, a loop is formed which results in the current at node 149 being relatively constant with temperature. Here, that coupling is effected with a switch formed by transistors 148 and 150. When the SHUTDOWN signal is a positive current, indicating that $V_{in}>V_{th}$, transistor 148 is turned on and the feedback loop is closed, thereby enabling the bandgap voltage source to operate. The diode connection around transistor 142 closes the loop on the top side, while the switch circuit (transistors 148 and 150) closes the loop on the bottom side. The base of transistor 150 is modulated using the internal feedback of the loop to sink the excess current received via SHUTDOWN. When the loop is operating, a largely temperature-insensitive current produced at node 149 can be used to drive additional transistors (154) to produce bias currents as needed. When SHUTDOWN goes to zero, indicating that $V_{in}>V_{th}$, the loop current falls to zero along with the bandgap voltage.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A low voltage shutdown circuit, comprising:
   an input node for receiving a voltage $V_{in}$ to be monitored;
   first and second voltage-to-current converters arranged to receive $V_{in}$ at respective inputs and to convert $V_{in}$ to currents I1 and I2 at respective outputs, said converters having respective voltage-to-current transfer functions which intersect at a predetermined non-zero threshold voltage $V_{th}$, wherein said first and second voltage-to-current converters comprise:
      first and second resistors connected in series between $V_{in}$ and a first node, the junction between said first and second resistors being a second node;
      a first bipolar transistor connected between said first node and a circuit common point, said transistor's base directly connected to said second node;
      a second bipolar transistor connected to form a current mirror with said first bipolar transistor, the current conducted by said second bipolar transistor being I1; and
      a third bipolar transistor having its base directly connected to said first node and its emitter connected to said circuit common point, the current conducted by said third bipolar transistor being I2; and
   a current comparison circuit arranged to produce an output which is in a first state when I1<I2 and in a second state when I1>I2 such that said output toggles when $V_{in}$ falls below $V_{th}$.

2. The shutdown circuit of claim 1, wherein the emitter of said third bipolar transistor is larger than the emitters of said first and second bipolar transistors.

3. The shutdown circuit of claim 1, wherein said current comparison circuit comprises:
   a supply voltage VDD;
   a VDD-referred current mirror arranged to mirror current I1 to a first node, said minor arranged such that said mirrored current is related to I1 by an associated ratio A, said current I2 connected to said first node, said first node being said current comparison circuit output such that said output is in said first state when I1<A*I2 and in a second state when I1>A*I2.

4. The shutdown circuit of claim 1, wherein said current comparison circuit comprises:
   a supply voltage VDD;
   a first VDD-referred current mirror comprising a diode-connected input transistor connected to a third node and an output transistor, said first mirror arranged to mirror current I2 to a fourth node, said first mirror arranged such that said mirrored current is related to I2 by an associated ratio A; and
   a second VDD-referred current minor comprising a diode-connected input transistor connected to said fourth node and an output transistor, said second minor arranged to mirror a current applied at said fourth node to a fifth node, said current I1 connected to said fourth node;
   said fifth node being said current comparison circuit output such that said output is in said first state when I1>A*I2 and in said second state when I1<A*I2 such that said current comparison circuit output toggles when $V_{in}$ falls below $V_{th}$.

5. The shutdown circuit of claim 1, further comprising a bias current generating circuit arranged to generate one or more bias currents when said current comparison circuit output indicates that $V_{in}>V_{th}$ and to shut down when said current comparison circuit output indicates that $V_{in}<V_{th}$.

6. The shutdown circuit of claim 5, wherein said bias current generating circuit comprises:
   a voltage source which includes a feedback loop, said voltage source providing a fixed current suitable for generating one or more bias currents when said feedback loop is closed, and
   a switch which operates in response to said current comparison circuit output and is arranged to close said feedback loop when said current comparison circuit output indicates that $V_{in}>V_{th}$ and to break said feedback loop when said current comparison circuit output indicates that $V_{in}<V_{th}$.

7. The shutdown circuit of claim 6, wherein said voltage source is a bandgap voltage source.

8. A low voltage shutdown circuit, comprising:
   an input node for receiving a voltage $V_{in}$ to be monitored;
   first and second voltage-to-current converters arranged to receive $V_{in}$ at respective inputs and to convert $V_{in}$ to currents I1 and I2 at respective outputs, said converters having respective voltage-to-current transfer functions which intersect at a predetermined non-zero threshold voltage $V_{th}$;
   a current comparison circuit arranged to produce an output which is in a first state when I1<I2 and in a second state when I1>I2 such that said output toggles when $V_{in}$ falls below $V_{th}$; and
   a bias current generating circuit arranged to generate one or more bias currents when said current comparison circuit output indicates that $V_{in}>V_{th}$ and to shut down when said current comparison circuit output indicates that $V_{in}<V_{th}$, wherein said bias current generating circuit comprises:
      a bandgap voltage source which includes a feedback loop, said bandgap voltage source providing a fixed current suitable for generating one or more bias currents when said feedback loop is closed, and
      a switch which operates in response to said current comparison circuit output and is arranged to close said feedback loop when said current comparison circuit output indicates that $V_{in}>V_{th}$ and to break said feedback loop when said current comparison circuit output indicates that $V_{in}<V_{th}$;
   wherein said bandgap voltage source comprises:
      a first PNP transistor connected between a supply voltage and a first node;

a second PNP transistor connected between a supply voltage and a second node, the bases of said first and second PNP transistors connected together at a third node;

a first NPN transistor connected between said first node and a circuit common point;

a second NPN transistor connected between said second node and a fourth node, the bases of said first and second NPN transistors connected together at a fifth node, the emitter area of said second NPN transistor being larger than that of said first NPN transistor;

a first resistor connected between said fourth node and said circuit common point;

a second resistor connected between said fifth node and said circuit common point; and a third NPN transistor connected between said third node and said fifth node such that, when the base of said third NPN transistor is coupled to the collector of said first NPN transistor, said bandgap voltage source provides said fixed current at said third node.

9. The shutdown circuit of claim 8, wherein said switch comprises said third NPN transistor and a third PNP transistor connected between the base of said third NPN transistor and said circuit common point, the base of said third PNP transistor connected to said first node; the base of said third NPN transistor coupled to said current comparison circuit output such that said third NPN transistor is on and the base of said third NPN transistor is thereby coupled to the collector of said first NPN transistor via said third PNP transistor when said current comparison circuit output indicates that $V_{in}>V_{th}$, and such that said third NPN transistor is off when said current comparison circuit output indicates that $V_{in}<V_{th}$.

* * * * *